United States Patent
Sun

(10) Patent No.: US 10,944,079 B2
(45) Date of Patent: Mar. 9, 2021

(54) FLEXIBLE DISPLAY PANEL AND METHOD FOR FABRICATING THE SAME

(71) Applicant: BOE Technology Group Co., Ltd., Beijing (CN)

(72) Inventor: Wenwen Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/149,198

(22) Filed: Oct. 2, 2018

(65) Prior Publication Data

US 2019/0189971 A1  Jun. 20, 2019

(30) Foreign Application Priority Data

Dec. 14, 2017  (CN) .......................... 201711338686.5

(51) Int. Cl.
| | | |
|---|---|---|
| *H01L 51/52* | (2006.01) | |
| *H01L 27/32* | (2006.01) | |
| *H01L 51/00* | (2006.01) | |
| *H01L 51/56* | (2006.01) | |
| *F03G 7/06* | (2006.01) | |
| *G06F 3/041* | (2006.01) | |

(52) U.S. Cl.
CPC ........ *H01L 51/5281* (2013.01); *H01L 27/323* (2013.01); *H01L 27/3244* (2013.01); *H01L 51/0097* (2013.01); *H01L 51/5253* (2013.01); *H01L 51/56* (2013.01); *F03G 7/065* (2013.01); *G06F 3/0412* (2013.01); *G06F 2203/04102* (2013.01); *G06F 2203/04103* (2013.01); *H01L 2251/5338* (2013.01)

(58) Field of Classification Search
CPC . H01L 51/5281; H01L 51/56; H01L 51/5253; H01L 51/0097; H01L 27/323; H01L 27/3244; H01L 2251/5338; F03G 7/065; G06F 2203/04103; G06F 2203/04102; G06F 3/0412; G09F 9/301
See application file for complete search history.

(56) References Cited

U.S. PATENT DOCUMENTS

| | | | |
|---|---|---|---|
| 10,547,025 B2* | 1/2020 | Choi | H01L 51/0097 |
| 10,681,823 B2* | 6/2020 | Kim | G06K 9/0004 |
| 10,686,148 B2* | 6/2020 | Jang | H01L 27/1218 |
| 2015/0212548 A1* | 7/2015 | Namkung | G06F 1/1643 345/174 |
| 2016/0064685 A1* | 3/2016 | Kim | B32B 37/003 257/40 |
| 2016/0093644 A1* | 3/2016 | Ki | H01L 27/1222 257/40 |
| 2016/0093685 A1* | 3/2016 | Kwon | H01L 27/3276 257/40 |
| 2018/0183001 A1* | 6/2018 | Lee | H01L 51/0097 |
| 2019/0274222 A1* | 9/2019 | Kim | H04M 1/0277 |

\* cited by examiner

*Primary Examiner* — Victor A Mandala
(74) *Attorney, Agent, or Firm* — Arent Fox LLP; Michael Fainberg

(57) ABSTRACT

The disclosure discloses a flexible display panel and a method for fabricating the same, the flexible display panel includes: a flexible substrate and a light-emitting element formed on the flexible substrate, wherein the light-emitting element includes a light-emitting layer, a polarization sheet is arranged on a light-emitting side of the light-emitting element, and the flexible display panel further includes a stress buffer layer.

12 Claims, 2 Drawing Sheets

FLEXIBLE DISPLAY PANEL AND METHOD FOR FABRICATING THE SAME

CROSS-REFERENCE TO RELATED APPLICATION

This Application claims priority to Chinese Patent Application No. 201711338686.5, filed on Dec. 14, 2017, the content of which is incorporated by reference in the entirety.

TECHNICAL FIELD

This disclosure relates to the field of display technologies, and particularly to a flexible display panel and a method for fabricating the same.

DESCRIPTION OF THE RELATED ART

A flexible display panel in the related art includes a plurality of bonded functional layers including a flexible substrate, a polarization sheet, a touch screen, a protection film, etc., where the polarization sheet has so poor characteristics of heat-resistance and humidity-resistance that it tends to be warped and deformed in a high-temperature and high-humidity environment, so that the entire flexible display panel may be warped and deformed, thus degrading a display effect of the display and even destroying the structure of some layer in the display.

SUMMARY

Embodiments of the disclosure provide a flexible display panel and a method for fabricating the same.

In one aspect, the embodiments of the disclosure provide a flexible display panel including: a flexible substrate and a light-emitting element formed on the flexible substrate, wherein the light-emitting element includes a light-emitting layer, a polarization sheet is arranged on a light-emitting side of the light-emitting element, and the flexible display panel further includes a stress buffer layer.

In some embodiments, the stress buffer layer is adjacent to the polarization sheet.

In some embodiments, the stress buffer layer is located on a side of the polarization sheet facing the light-emitting layer.

In some embodiments, the stress buffer layer contacts with a surface of the polarization sheet facing the light-emitting layer.

In some embodiments, the stress buffer layer is made of a metal material.

In some embodiments, the metal material is a shape memory alloy.

In some embodiments, a thickness of the stress buffer layer ranges from 0.2 micrometers to 5 micrometers.

In some embodiments, a touch substrate is arranged on a side of the polarization sheet facing away from the light-emitting layer.

In some embodiments, the stress buffer layer has a grid-shaped structure.

In some embodiments, the stress buffer layer has a cellular structure.

In some embodiments, the stress buffer layer has a strip-shaped structure.

In some embodiments, the flexible display panel further includes an encapsulation layer formed on a side of the light-emitting element facing away from the flexible substrate.

In some embodiments, the polarization sheet is located on a side of the encapsulation layer facing away from the flexible substrate.

In some embodiments, a protection layer is arranged on a side of the polarization sheet facing away from the light-emitting layer.

In some embodiments, the light-emitting side of the light-emitting element is a side of the light-emitting element facing away from the flexible substrate.

In some embodiments, the light-emitting side of the light-emitting element is a side of the light-emitting element facing the flexible substrate.

In another aspect, the embodiments of the disclosure provide a method for fabricating a flexible display panel, the method includes an operation of forming a light-emitting element on a flexible substrate, wherein the light-emitting element includes a light-emitting layer; and the method further includes: forming a stress buffer layer on the flexible substrate; patterning the stress buffer layer; and fitting a polarization sheet onto the flexible substrate.

In some embodiments, the stress buffer layer is formed on the flexible substrate via a magnetron sputtering coating process.

In some embodiments, patterning the stress buffer layer includes: patterning the stress buffer layer via a photolithographic process, a dry etching process or a wet etching process.

In some embodiments, after fitting the polarization sheet onto the flexible substrate, the method further includes: fitting a protection layer onto the polarization sheet.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those ordinarily skilled in the art without any inventive effort shall fall into the claimed scope of the disclosure.

Figure 1:
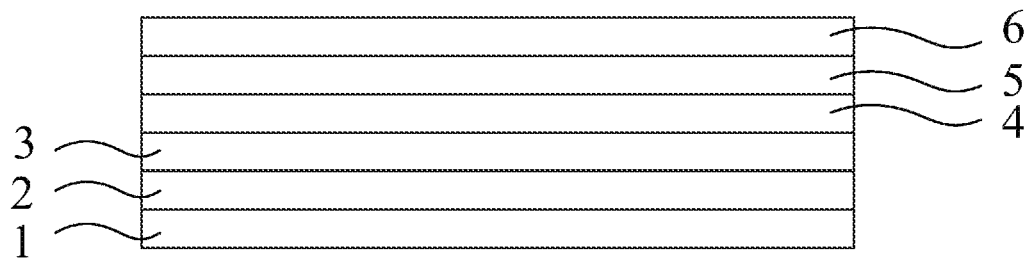
FIG. 1 is a schematic structural diagram of a flexible display panel according to the embodiments of the disclosure.

Referring to FIG. 1, a flexible display panel according to the embodiments of the disclosure includes a flexible substrate 1 and a light-emitting element formed on the flexible substrate 1, where the light-emitting element includes a light-emitting layer 2, a polarization sheet 5 is arranged on a light-emitting side of the light-emitting element, and the flexible display panel further includes a stress buffer layer 4.

The stress buffer layer 4 is arranged in the flexible display panel above according to the embodiments of the disclosure, and when the polarization sheet 5 operating in a high-temperature and high-humidity environment has a tendency to be deformed, the stress buffer layer 4 generates a force in an opposite direction to a direction in which the polarization sheet 5 tends to be deformed, to thereby suppress the polarization sheet 5 from being deformed, so as to keep the polarization sheet 5 flat, thus preventing in effect the entire flexible display panel from being warped and deformed, and improving a display effect and a service lifetime of the flexible display panel.

In some embodiments, the stress buffer layer 4 is adjacent to the polarization sheet 5.

In some embodiments, the stress buffer layer 4 is located on a side of the polarization sheet 5 facing the light-emitting layer 2.

In some embodiments, the stress buffer layer 4 contacts with a surface of the polarization sheet 5 facing the light-emitting layer 2.

In some embodiments, the stress buffer layer 4 is made of a metal material.

In some embodiments, the flexible display panel further includes an encapsulation layer 3 formed on a side of the light-emitting element facing away from the flexible substrate 1.

Since the metal material has characteristics of excellent water and oxygen-resistance, and bend-resistance, the probability that the outermost inorganic material layer of the encapsulation layer 3 is cracked can be lowered to thereby prevent water and oxygen from entering and damaging the light-emitting layer 2, so as to protect the inorganic material layer and the light-emitting layer 2, thus optimizing the characteristics of aging-resistance and mechanical factor-resistance of the encapsulation layer.

In some embodiments, the metal material is a shape memory alloy.

The metal material above according to the embodiments of the disclosure is a shape memory alloy, and since the shape memory alloy can be restored to its original shape under a high-temperature condition, where the original shape of the shape memory alloy is a flat shape in the embodiments of the disclosure, when the polarization sheet 5 has a tendency to be deformed, the shape memory alloy can suppress the polarization sheet 5 from being deformed, so as to avoid the flexible display panel from being deformed, which would otherwise degrade a display effect.

In some embodiments, the shape memory alloy is a nickel-titanium alloy.

In some embodiments, a thickness of the stress buffer layer 4 ranges from 0.2 micrometers to 5 micrometers.

Figure 2:
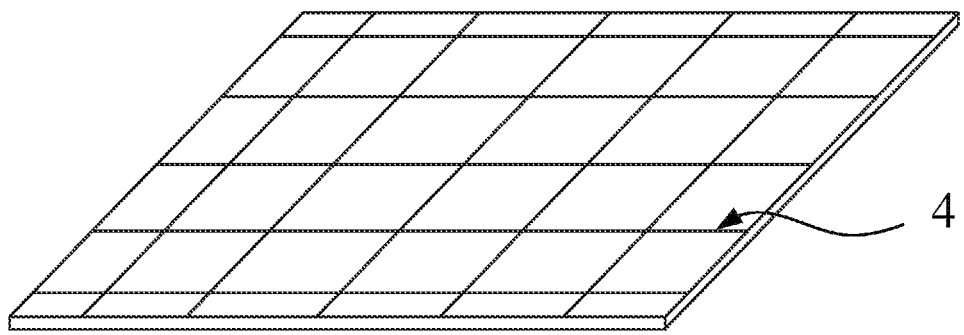
FIG. 2 is a schematic structural diagram of a grid-shaped stress buffer layer according to the embodiments of the disclosure.

In some embodiments, as illustrated in FIG. 2, the stress buffer layer 4 is in a grid-shaped structure in one implementation.

Figure 3:
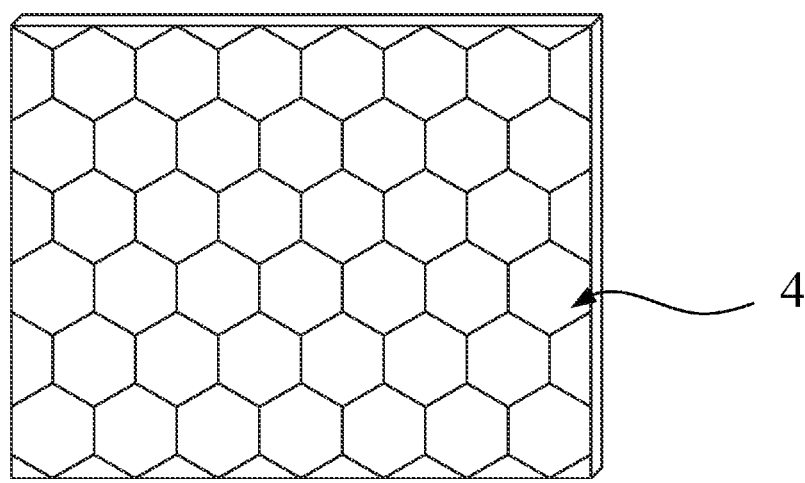
FIG. 3 is a schematic structural diagram of a cellular stress buffer layer according to the embodiments of the disclosure.

In some embodiments, as illustrated in FIG. 3, the stress buffer layer 4 is in a cellular structure in another implementation.

In some embodiments, an edge length of each grid of the grid-shaped structure as illustrated in FIG. 2 and an edge length of each cell of the cellular structure as illustrated in FIG. 3 ranges from 100 micrometers to 300 micrometers, and an edge width of each grid of the grid-shaped structure as illustrated in FIG. 2 and an edge width of each cell of the cellular structure as illustrated in FIG. 3 ranges from 1/20 to 3/10 of a corresponding edge length thereof.

The stress buffer layer in either the grid-shaped structure as illustrated in FIG. 2 or the cellular structure as illustrated in FIG. 3 can alleviate an influence on the transmittance of light exiting from the flexible display panel, and also the stress buffer layer can come into uniform contact with the polarization sheet so that a force is applied uniformly to the polarization sheet, and when the polarization sheet has a tendency to be deformed, the stress buffer layer can be restored to a preset shape and generate a force in an opposite direction to a direction in which the polarization sheet tends to be deformed, so that a stress in a plane of the display device can be equalized and released in effect to thereby avoid the stress from being concentrated locally, which would otherwise deform the display device.

Figure 4:
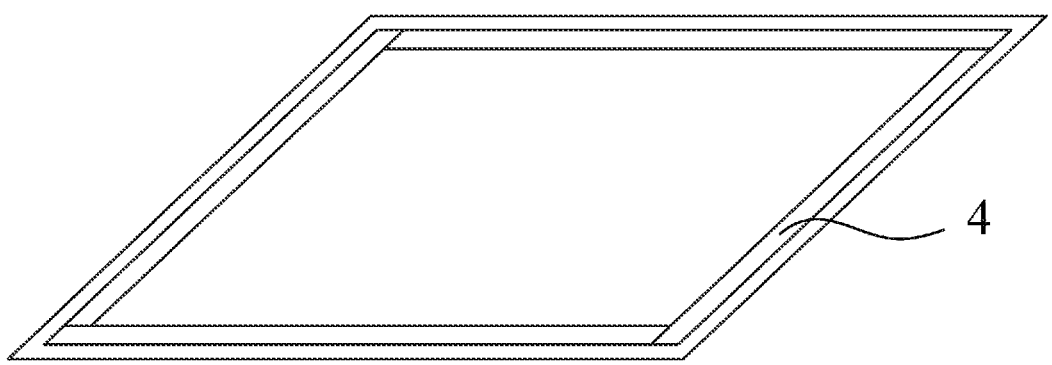
FIG. 4 is a schematic structural diagram of a strip-shaped stress buffer layer according to the embodiments of the disclosure.

In some embodiments, as illustrated in FIG. 4, the stress buffer layer 4 is in a strip-shaped structure in a further implementation.

In some embodiments, a distance between an outer edge of the stress buffer layer 4 in the strip-shaped structure, and an outer edge of the polarization sheet 5 ranges from 3 micrometers to 10 micrometers.

The stress buffer layer in the strip-shaped structure comes into contact with only an edge of the polarization sheet, so that the stress in the plane of the display device can be equalized and released in effect to thereby avoid the stress from being concentrated locally, which would otherwise deform the display device, and at the same time, the transmittance of the emergent light can also be improved to thereby improve the brightness of the flexible display panel.

In some embodiments, the polarization sheet 5 is located on a side of the encapsulation layer 3 facing away from the flexible substrate 1.

In some embodiments, a touch substrate is arranged on a side of the polarization sheet 5 facing away from the light-emitting layer 2.

In some embodiments, a protection layer 6 is arranged on a side of the polarization sheet 5 facing away from the light-emitting layer 2.

In some embodiments, the protection layer 6 is arranged on a side of the touch substrate facing away from the light-emitting layer 2.

The protection layer can be arranged to protect the polarization sheet and the other layers in the flexible display panel, so as to avoid the polarization sheet and the other layers from being damaged.

In some embodiments, the flexible display panel according to the embodiments of the disclosure can be structured in following implementations dependent upon whether the flexible display panel emits light from a bottom or a top thereof.

The first implementation: as illustrated in FIG. 1, the light-emitting layer 2, the encapsulation layer 3, the stress buffer layer 4, the polarization sheet 5 and the protection layer 6 are arranged on the flexible substrate 1 in that order. At this time, the light-emitting side of the light-emitting element is a side of the light-emitting element facing away from the flexible substrate 1.

The second implementation: the light-emitting layer 2 and the encapsulation layer 3 are arranged on a side of the flexible substrate 1 in that order; and the stress buffer layer 4, the polarization sheet 5 and the protection layer 6 are arranged on a side of the flexible substrate 1 facing away from the light-emitting layer 2 in that order. At this time, the light-emitting side of the light-emitting element is a side of the light-emitting element facing the flexible substrate 1.

Based upon a same inventive concept, the embodiments of the disclosure further provide a method for fabricating a flexible display panel, where the method includes an operation of forming a light-emitting element on a flexible substrate 1, where the light-emitting element includes a light-emitting layer 2; and the method further includes the following operations.

Forming a stress buffer layer 4 on the flexible substrate 1.

Patterning the stress buffer layer 4; and fitting the polarization sheet 5 onto the flexible substrate 1.

In the method above for fabricating the flexible display panel, the stress buffer layer 4 is arranged on a side of the polarization sheet 5, and since the polarization sheet 5 tends to be warped and deformed in a high-temperature and high-humidity environment, and the stress buffer layer 4 can be restored to a preset shape in a high-temperature environment, when the polarization sheet 5 operating in the high-temperature and high-humidity environment has a tendency to be deformed, the stress buffer layer 4 is restored to the preset shape and generates a force in an opposite direction to a direction in which the polarization sheet 5 tends to be deformed, to thereby suppress the polarization sheet 5 from being deformed, so as to keep the polarization sheet 5 flat, thus preventing in effect the entire flexible display panel from being warped and deformed, and improving a display effect and a service lifetime of the flexible display panel.

In some embodiments, after fitting the polarization sheet 5 onto the flexible substrate 1, the method further includes: fitting a protection layer 6 onto the polarization sheet 5.

The protection layer 6 is adhered on a side of the polarization sheet 5 facing away from the stress buffer layer 4 to thereby protect the entire flexible display panel, so as to prevent the display screen from being damaged due to an external strike, thus improving the service lifetime of the flexible display panel.

In some embodiments, the stress buffer layer 4 is formed on the flexible substrate 1 via a magnetron sputtering coating process.

In some embodiments, the stress buffer layer 4 is patterned via a photolithographic process, a dry etching process, or a wet etching process.

In some embodiments, after forming the light-emitting element on the flexible substrate 1, and before forming the stress buffer layer 4 on the flexible substrate 1, the method further includes: forming an encapsulation layer 3 on a side of the light-emitting element facing away from the flexible substrate 1.

In some embodiments, patterning the stress buffer layer 4 via the photolithographic process includes the following operations.

Forming a metal layer on the encapsulation layer 3 or the flexible substrate 1.

Coating photoresist on the metal layer.

Exposing the photoresist using a mask.

Developing the exposed photoresist.

Etching the metal layer in a completely-removed zone for the photoresist via an etching process; and stripping the remaining photoresist to form the stress buffer layer 4.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A flexible display panel, comprising: a flexible substrate and a light-emitting element formed on the flexible substrate, wherein the light-emitting element comprises a light-emitting layer, a polarization sheet is arranged on a light-emitting side of the light-emitting element, and the flexible display panel further comprises a stress buffer layer; wherein the stress buffer layer is made of a metal material; wherein the metal material is a shape memory alloy; wherein the stress buffer layer is adjacent to the polarization sheet; wherein the stress buffer layer is located on a side of the polarization sheet facing the light-emitting layer.

2. The flexible display panel according to claim 1, wherein the stress buffer layer contacts with a surface of the polarization sheet facing the light-emitting layer.

3. The flexible display panel according to claim 1, wherein a thickness of the stress buffer layer ranges from 0.2 micrometers to 5 micrometers.

4. The flexible display panel according to claim 1, wherein a touch substrate is arranged on a side of the polarization sheet facing away from the light-emitting layer.

5. The flexible display panel according to claim 1, wherein the stress buffer layer has a grid-shaped structure.

6. The flexible display panel according to claim 1, wherein the stress buffer layer has a cellular structure.

7. The flexible display panel according to claim 1, wherein the stress buffer layer has a strip-shaped structure.

8. The flexible display panel according to claim 1, wherein the flexible display panel further comprises an encapsulation layer formed on a side of the light-emitting element facing away from the flexible substrate.

9. The flexible display panel according to claim 8, wherein the polarization sheet is located on a side of the encapsulation layer facing away from the flexible substrate.

10. The flexible display panel according to claim 1, wherein a protection layer is arranged on a side of the polarization sheet facing away from the light-emitting layer.

11. The flexible display panel according to claim 1, wherein the light-emitting side of the light-emitting element is a side of the light-emitting element facing away from the flexible substrate.

12. The flexible display panel according to claim 1, wherein the light-emitting side of the light-emitting element is a side of the light-emitting element facing the flexible substrate.

* * * * *